(12) United States Patent
Nitz

(10) Patent No.: US 6,882,149 B2
(45) Date of Patent: Apr. 19, 2005

(54) METHOD AND SYSTEM FOR MAGNETIC RESONANCE IMAGING

(75) Inventor: Wolfgang Nitz, Buch (DE)

(73) Assignee: Siemens Aktiengesellschaft, Münich (DE)

( * ) Notice: Subject to any disclaimer, the term of this patent is extended or adjusted under 35 U.S.C. 154(b) by 9 days.

(21) Appl. No.: 10/307,763

(22) Filed: Dec. 2, 2002

(65) Prior Publication Data

US 2003/0117138 A1 Jun. 26, 2003

(30) Foreign Application Priority Data

Dec. 10, 2001 (DE) .......................................... 101 60 530

(51) Int. Cl.⁷ ................................................. G01V 3/00
(52) U.S. Cl. ..................................... 324/309; 600/410
(58) Field of Search ................................ 324/309, 307, 324/306, 314, 312, 300; 600/410

(56) References Cited

U.S. PATENT DOCUMENTS

| | | | |
|---|---|---|---|
| 5,512,826 A | * | 4/1996 | Hardy et al. ................ 324/309 |
| 5,938,599 A | | 8/1999 | Rasche et al. |
| 6,275,035 B1 | * | 8/2001 | Debbins et al. ............. 324/307 |
| 6,301,497 B1 | * | 10/2001 | Neustadter .................. 600/410 |

OTHER PUBLICATIONS

"Techniken Der Magnetresonanz–Angiographie," Laub et al., electromedica, vol. 66, No. 2, (1998) pp. 62–70.

* cited by examiner

*Primary Examiner*—Louis Arana
(74) *Attorney, Agent, or Firm*—Schiff Hardin LLP

(57) ABSTRACT

In a method and a system for magnetic resonance (MR) imaging, an MR exposure of a body region is implemented with an MR system, a trajectory within the body region is prescribed in a coordinate system of the MR system on the basis of the MR exposure, and MR tomograms within the body region at individual positions along the trajectory are automatically angled relative to the patient or magnet coordinate system dependent on a perspective pre-selected by an operator. This angling is calculated from the trajectory at the individual positions in the prescribed perspective such that a maximum segment of the trajectory is contained in each of the MR tomograms. The tracking of objects in body canals or vessels by means of MR imaging is considerably simplified with the method and the appertaining system.

12 Claims, 3 Drawing Sheets

METHOD AND SYSTEM FOR MAGNETIC RESONANCE IMAGING

BACKGROUND OF THE INVENTION

1. Field of the Invention

The present invention is directed to a method for magnetic resonance (MR) imaging, wherein multiple MR tomograms at different positions within a body region to be examined are acquired in temporal succession and presented. The invention is also directed to an MR system for the implementation of such a method.

2. Description of the Prior Art

Magnetic resonance tomography is a known technology for acquiring images of the inside of the body of a living examination subject. For implementation of magnetic resonance tomography, a basic field magnet generative a static, relatively homogeneous basic magnetic field. During the acquisition of the MR tomograms, rapidly switched gradient fields that are generated by gradient coils are superimposed on this basic magnetic field. Radio-frequency pulses for triggering magnetic resonance signals are emitted into the examination subject with radio-frequency transmission antennas. The magnetic resonance signals produced with these radio-frequency pulses are registered by radio-frequency reception antennas. The magnetic resonance images of the examined body region of the examination subject are produced on the basis of these magnetic resonance signals received with the reception antennas. Each picture element in the magnetic resonance image corresponds to an intensity value of a received magnetic resonance signal of a small body volume. By suitable control of the currents in the gradient coils, MR tomograms can be acquired at different positions and at different angular attitudes, i.e. at different angular positions of the acquired slice relative to the z-axis of the magnetic resonance apparatus.

MR angiography, wherein images of the vascular system of the body region to be examined are acquired, represents a sub-field of magnetic resonance tomography. The required image contrast can be enhanced by introducing a contrast agent into the portrayable vessels before or during the MR exposure. This technique is also known by the name of ceMRA (contrast enhanced magnetic resonance angiography). For visual presentation of a larger area of a vascular system to be acquired, a technique referred to as MIP (Maximum Intensity Protection) is often utilized. All acquired MR tomograms of the vascular system are combined to form a three-dimensional dataset. A family of parallel lines is placed through this dataset. That point having the highest signal intensity along each individual line is selected. Due to the fact that blood vessels having high signal intensity are imaged, exactly one picture element that belongs to a vessel is thus selected along each line. This element is then entered into that projection plane at the end of a line that is perpendicular to the parallel lines. A projection image of the vascular system arises in this way. Different vascular projections are calculated by changing the direction of the projection lines. When these projections are successively presented at a monitor, then an observer receives a spatial impression of the vascular system.

One application of MR angiography relates to MR-guided vessel intervention wherein an interventional instrument introduced into a vessel of a body region is tracked by means of simultaneous MR imaging. The instrument itself, for example a guide wire, a stent or a balloon catheter, can be identified or recognized in the MR tomogram via the artifact caused by its magnetic susceptibility. This technique is referred to as "passive tracking". The instrument itself can be constructed as an "active" resonant circuit, an "active" antenna or with "active" coils, so the identification of the position of the instrument in the slice can ensue with a local signal pick-up or by a signal super-elevation. This technique is referred to as "active tracking".

In these applications, the operator of the MR system must manually enter the position and angulation of the 2D slice of the MR tomogram to be acquired via a graphic interface that is overlaid on the MIP presentation of a ceMRA. The checking of the correct positioning ensues by implementing the imaging sequence, i.e. by acquiring the MR tomogram at the input position in the selected angular attitude. In the search for the interventional instrument, this procedure must be repeated for every point along the vessel. This procedure is also repeated after the locating of the intervertional instrument when the latter is moved forward in the framework of the minimally invasive intervention, The search for and the tracking of the interventional instrument are extremely time-consuming compared to a competing imaging technique wherein the tracking of the instrument ensues with conventional X-ray fluoroscopy.

A comparable problem arises in instances wherein an object, for example an endoscope or a probe, introduced into a body canal or tract is to be tracked with MR imaging.

SUMMARY OF THE INVENTION

An object of the present invention is to provide a method as well as a system for magnetic resonance imaging that enable the simplified tracking of an object located in a body channel, particularly a vessel, of a body region to be examined.

The above object is achieved in accordance with the present invention in a method and a system for magnetic resonance imaging, wherein a magnetic resonance (MR) exposure of a body region is implemented with an MR system, a trajectory within the body region is prescribed in a coordinate system of the MR system on the basis of the MR exposure, and MR tomograms within the body region are acquired along the trajectory with an angular attitude that is calculated from the trajectory at respective positions in a prescribable perspective display, the calculation being such that a maximum segment of the trajectory is contained in each of the MR tomograms.

In the inventive method, an MR exposure of the body region to be examined is first undertaken with an MR system. This MR exposure can ensue, for example, with the ceMRA technique for registering a vessel tree and subsequent MIP presentation of the three-dimensional exposure, possibly from different perspectives. On the basis of this MR exposure, a trajectory or a path within the body region encompassed by the MR exposure is inventively prescribed in a coordinate system of the MR system, i.e. a coordinate system permanently associated with this system. A course within the body channel or the vessel within which the object is to be tracked is selected within the body region under examination on the basis of the MR exposure. The prescription or pre-planning of the trajectory can ensue, for example, by marking individual points in the respective perspective or three-dimensional presentation or presentations of the MR exposure along the desired path or can also ensue by marking all alternatively possible but unwanted paths. As used herein a "trajectory" means a three-dimensional curve in the coordinate system of the MR system. By prescribing individual points, this trajectory can be automatically calculated by a straight-line connection of the points or by fitting a curve to these points. After the definition of the trajectory, MR tomograms of the body region under examination are acquired at individual, prescribable positions along the trajectory with an angular attitude that is calculated from the trajectory in a perspective prescribable for each MR tomogram, given the criterion that a maximum segment of the trajectory is contained in each MR tomogram. The MR tomograms of the body region under examination are thus automatically angled relative to the patient or magnet coordinate system at the respective, individually prescribed positions along the trajectory according to the perspective pre-selected by the user. This angling is calculated from the trajectory in the respective pre-selected perspective in view of the above criterion.

In the utilization of the present method, a prescribable region, particularly the center, of the respective MR tomogram is always situated in the segment of, for example, a vessel intersected by the trajectory. By the angling of the acquired slice calculated from the trajectory, an optimally large segment of the trajectory or of the appertaining vessel or body canal can be respectively recognized in the MR tomogram. This facilitates the locating and the tracking of the object. The angular attitude for each MR tomogram can be calculated, for example, via the tangent at the respective position along the trajectory or the position of the corresponding neighboring points on the trajectory. The position of the respective slice is therefore adapted to the course of the trajectory or of the vessel. The operator of the MR system thus need only specify the desired slice position either directly or via a corresponding position on an axis of the coordinate system of the MR system, and the MR tomogram thereby is optimally oriented for the tracking of the object situated in the body. Of course, a manual adaptation of the angular attitude or position of the tomogram remains possible.

The registration of every individual MR tomogram can be started by a manual input. In an embodiment of the present method as well as the appertaining system, it is also possible to directly supply the MR system with the slice position by a measurement of the position of the object or of a part of the object. The operator then merely has to start the respective slice exposure if this does not ensue automatically at specific intervals.

A number of possibilities exist for prescribing the trajectory. For example, the MR exposure can be visualized in a three-dimensional presentation at a monitor, whereby the operator has the possibility of moving through the three-dimensional presentation via a corresponding input device and marking points of the trajectory at corresponding locations. The operator also can have the MR exposure presented in at least two different perspectives wherein the projected course of the trajectory is respectively marked with individual points. The three-dimensional trajectory also can be defined in the coordinate system of the MR system in this way. Further, there is the possibility of defining only the starting point of the trajectory in a displayed body canal or vessel and having the further course of the body canal or vessel that corresponds to the trajectory determined by means of an image recognition algorithm. Suitable algorithms for this purpose are known in the art.

The position for the MT tomogram to be acquired is preferably prescribed via the z-coordinate. The z-axis proceeds parallel to the displacement direction of the patient bed in an MR system. On the basis of the spatial prescription of the trajectory, this z-position is linked to an x-coordinate and a y-coordinate, so that the appertaining position on the trajectory is fixed by entering the z-position. Upon introduction of an instrument into the examined body region, the introduced length of the instrument also can be acquired and also entered as information from which the appertaining position on the trajectory can then be calculated for the respective MR tomogram. The acquisition of the introduced length, of course, also can ensue automatically via a measuring instrument, so that the operator of the MR system merely has to trigger the start of the MR tomogram exposure.

The MR system for the implementation of this method includes a known MR data acquisition device (scanner) with the appertaining magnets and coil systems and antenna systems, an image presentation device, an input device and a control unit. According to the present invention, such a known MR system is additionally equipped with a calculation unit that determines a trajectory in the coordinate system of the MR acquisition device from one or more data entries via the input unit and calculates a position and angular attitude of an MR tomogram to be produced on the trajectory on the basis of an axial position on one of the three orthogonal axes of this coordinate system that has been entered or can be derived from an input, so that a maximum segment of the trajectory is contained in the MR tomogram. The calculating unit forwards the position and angular attitude to the control unit for operating the MR acquisition device for the exposure of the respective MR tomogram. By linking the trajectory to the coordinate system of the MR acquisition device and calculating the respective slice position and attitude as well as by directly supplying the calculated position and attitude into the measurement controller for the position and attitude of the imaging sequence, a significantly simplified tracking of an object in a body canal or vessel of the examined body region is enabled. Existing MR systems merely have to be retrofitted with the calculating unit.

In an embodiment of this MR system, a measurement device is additionally provided that is connected to the calculating unit or to the input unit, that measures an introduce length of an instrument introduced into the body region and provides this measurement to the calculating device and/or input device as position information. The measurement device can be fashioned as optical or mechanical device, for example as a slide resistor. In this way, the specification of the slice position at which the next MR tomogram should be acquired is not longer required but is automatically supplied by the measurement device.

The suitable angling of the second (next) slice for the MR tomogram to be acquired is also dependent on the perspective from which the operator of the MR system wishes to see the body region. The angling of the slice is matched to the perspective prescribed by the operator. The perspective, for example A-P or lateral, can be entered by the operator before each acquisition of an MR tomogram. When no entry is made, then the perspective selected previously is retained.

DESCRIPTION OF THE PREFERRED EMBODIMENTS

Figure 1:
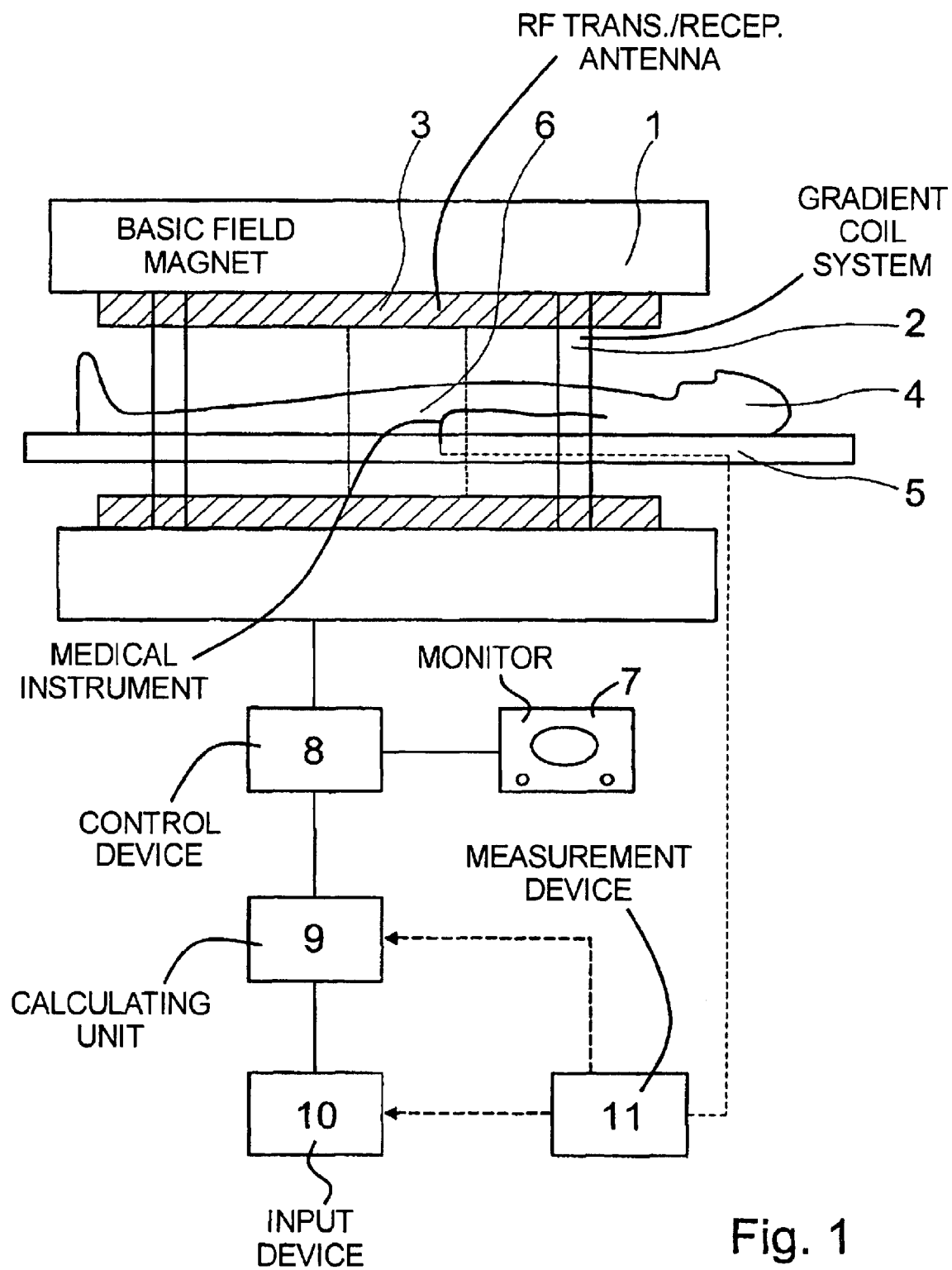
FIG. 1 illustrates an a example of the basic structure of a magnetic resonance tomography system with which the present method can be implemented.

FIG. 1 schematically shows a section through a magnetic resonance tomography apparatus that can be utilized for the implementation of the present method. Only the basic component parts of the apparatus are shown in FIG. 1, namely a basic field magnet 1, a gradient coil system 2 and a radio-frequency transmission and reception antenna 3. A patient 4 also is shown on a patient bed 5, the patient 4 representing the examination subject. In the measurement, one or more radio-frequency pulses for generating magnetic resonance signals are radiated into the body of the person 4 via the radio-frequency transmission antenna 3, and the generated magnetic resonance signals are acquired and presented in the form of a two-dimensional MR tomogram or MIP image. With broken lines, FIG. 1 shows the body region 6 of the patient in which an introduced object, a stent in the present examples introduced by a schematically-indicated catheter 15, is to be tracked with MR imaging during the introduction.

FIG. 1 also shows a control device 8 for operating the MR acquisition device for the implementation of an image acquisition as well as an image presentation device, a monitor 7 in the present case. Via an input device 10, usually in the form of a keyboard, as well as a multi-dimensional input device, for example a joystick, data are forwarded to a calculating unit 9 that implements the corresponding calculations and forwards the result to the control device 8. A measurement device 11 measures an introduced length of an object introduced into the body region 6, particularly a stent, and forwards the measured values to the calculating unit 9, possibly via the input device 10.

Figure 2:
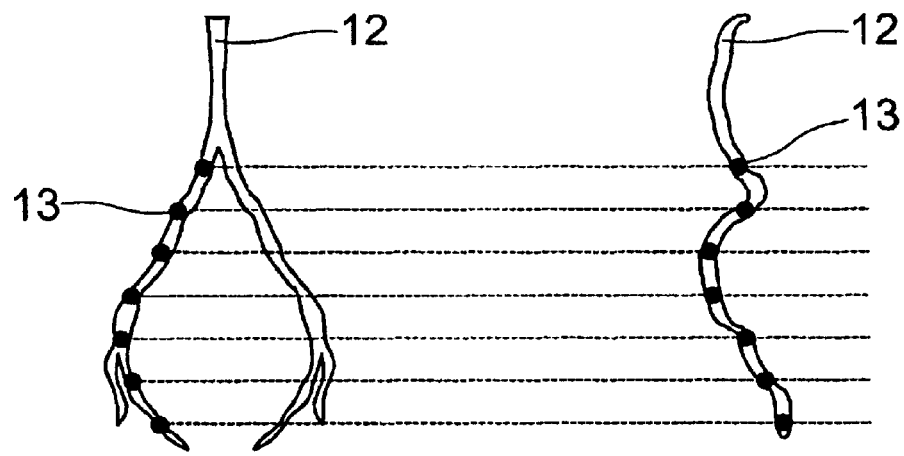
FIG. 2 is a schematic illustration of an example of an MR exposure of a vessel tree in two different perspectives.

The present method shall be explained again in brief below on the basis of an example for MR-guided stent placement in a pelvic artery having a stenosis. First, an exposure of the vessel tree from above the discharge of the renal artery to the branching of the respective iliac arteries is implemented with the assistance of a ceMRA technique. This MR exposure is presented to the operator of the system in a MIP presentation in A-P and lateral perspectives at the monitor 7. The presentation is shown highly schematically in FIG. 2, wherein the left side corresponds to the A-P perspective and the right side corresponds to the lateral perspective. For simplification, only the course of the thicker vessels 12 can be seen in FIG. 2. The operator now marks the desired trajectories in the two perspectives. This is shown in FIG. 2 with the points 13 that the operator marks in the respective presentations using a suitable input device 10, for example a mouse. The z-positions and x-positions for the desired path of the catheter 15 to be introduced are defined by the points 13 in the left perspective presentation; the z-positions and y-positions for the desired path of the catheter 15 to be introduced are defined by the points 13 in the illustration at the right. This definition ensues in the coordinate system permanently linked to the MR system, so that the course of the trajectory is fixed within this coordinate system.

The real-time MR imaging is subsequently started. One point of the 2D slice placement is defined by the trajectory. The angling of the slice is defined by the attitude of the neighboring points on the trajectory. Via the z-coordinate, the operator now defines the point 13a on the trajectory at which an MR tomogram is to be acquired and presented. The z-coordinate can be determined via the protocol menu, by a graphic slice positioning that is capable of real-time, via a multi-dimensional input device or via a joystick mounted at the patient bed. The attitude and the angle of the slice are prescribed via the course of the predetermined trajectory. The operator has the degree of freedom of the perspective, for example A-P or lateral. The operator also has the possibility of a fine correction if the patient has moved after the ceMRA exposure or when the introduced guide wire or catheter has slightly changed the vessel course.

Figure 3:
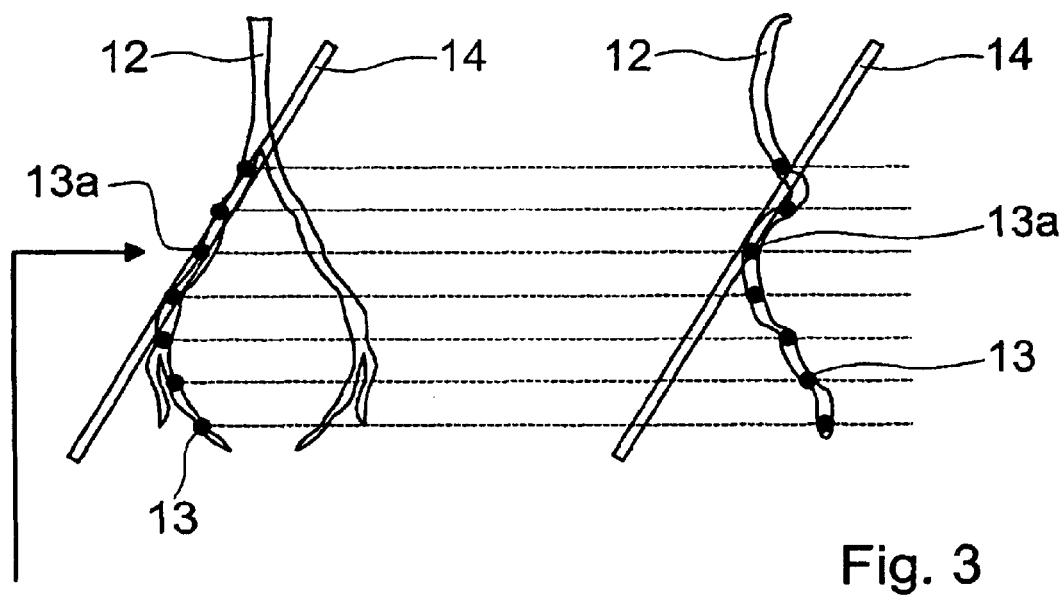
FIG. 3 shows an example of the position and attitude of the 2D slice for the acquisition of an MR tomogram in two perspectives.
Figure 4:
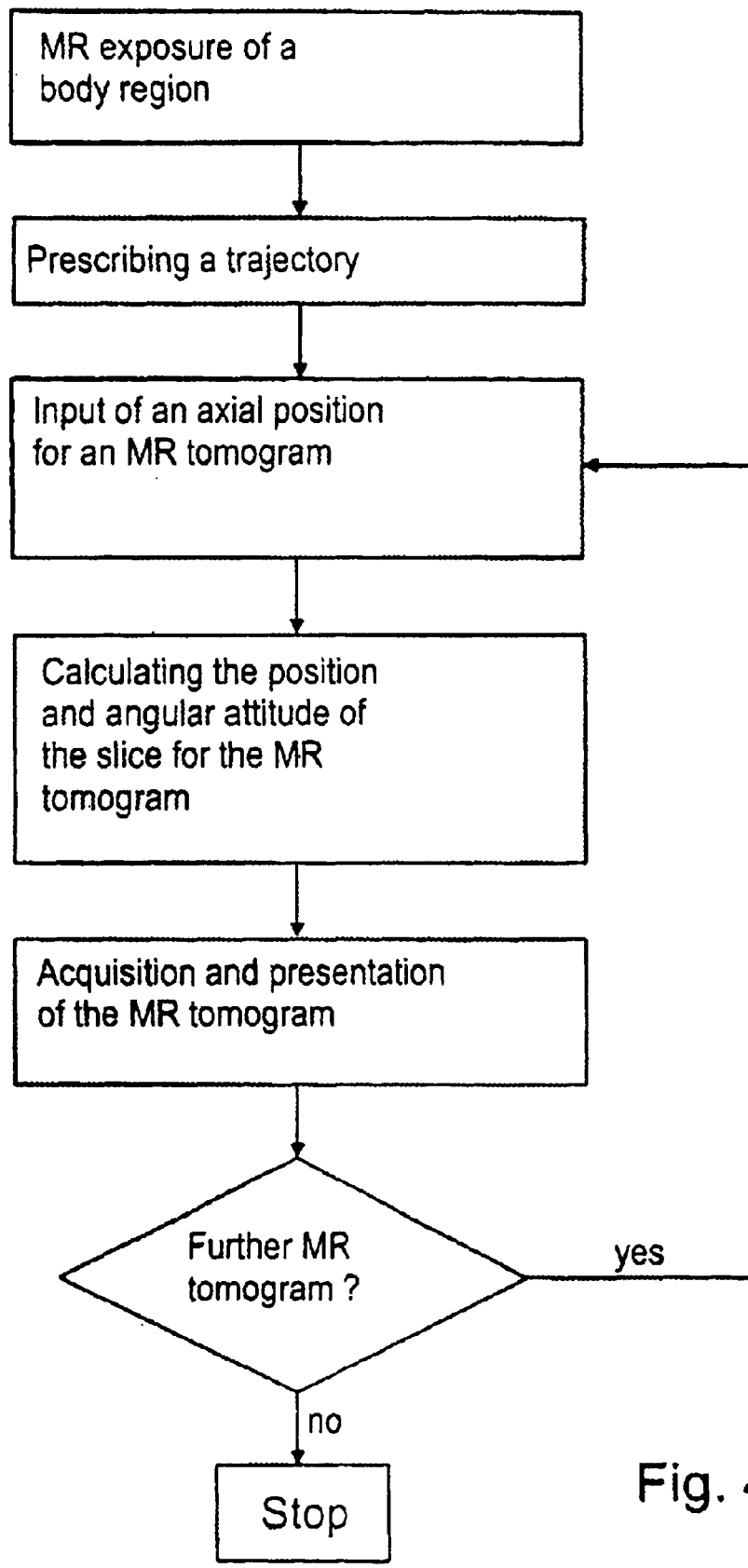
FIG. 4 is an exemplary flowchart of the present method.

As an example, FIG. 3 shows the trajectory-defined x-position and y-position as well as the trajectory-defined slice angling for a z-position indicated with the arrow. The left part of FIG. 3 again shows the A-P perspective of the vessel tree 12 with the points 13 of the trajectory. By prescribing the z-position, a 2D slice 14 is defined at this location that proceeds through the allocated point 13a on the trajectory and that is angled on the basis of the neighboring points such that an optimally large region of the vessel 12 defined by the trajectory can be recognized in the MR tomogram of this slice 14. When the operator selects this perspective, then the MR tomogram is acquired at this position and in this angular attitude and is displayed at the picture screen. When the operator selects the lateral perspective, as can be seen in the right side of FIG. 3, then the slice 14 is defined in a different orientation, and a maximum part of the trajectory again can be recognized in the corresponding MR tomogram. In this way, the operator always obtains an MR tomogram in an optimum presentation wherein an optimally large segment of the vessel 12 in which the catheter 15 is moved forward can be recognized in the center of the image, or in a preferred region of the registered image that can be defined by by operator. This facilitates tracking of the tip of the catheter 15 in a substantial way. The individual method steps can be seen as an example from the flowchart of FIG. 4.

In a further exemplary embodiment, an MR-guided stent placement is implemented in exhibiting renal artery in a stenosis. The steps explained in the preceding exemplary embodiment are implemented in the same way in the further exemplary embodiment. The coordinate that is the determining factor for the trajectory, however, now lies in the x-direction. The operator now defines the point on the trajectory at which an MR tomogram is to be acquired and presented via the x-coordinate. The x-coordinate can in turn be determined via he protocol menu, via a graphic slice positioning that is capable of real time, via a multi-dimensional input device or via a joystick mounted at the patient bed. Attitude and angle of the slice are again prescribed via the course of the predetermined trajectory. Here, as well, the operator has the degree of freedom of the perspective, for example A-P or cranio-caudal. if the patient has moved after the ceMRA exposure or if the introduced guide wire or catheter 15 has slightly changed the course of the vessel, the operator also has an input possibility for fine correction of the slice positioning and angling.

Although modifications and changes may be suggested by those skilled in the art, it is the inventor to embody within the patent warranted hereon all changes and modifications as reasonably and properly come within the scope of his contribution to the art.

I claim as my invention:

1. A method for magnetic resonance imaging comprising the steps of:

obtaining a magnetic resonance exposure of a body region of a subject using a magnetic resonance system having a coordinate system associated therewith;

in said magnetic resonance exposure, prescribing a trajectory as a three-dimensional curve within said body region in said coordinate system of said magnetic resonance system;

automatically electronically calculating respective angular attitudes for a plurality of magnetic resonance tomograms respectively at different, prescribable positions along said trajectory, each containing a segment of said trajectory, for, in a prescribable perspective view, maximizing the segment of said trajectory contained in each of said magnetic resonance tomograms; and acquiring said magnetic resonance tomograms with said magnetic resonance system.

2. A method as claimed in claim 1 wherein said coordinate system has three orthogonal axes, and wherein the step of calculating said respective positions of said magnetic resonance tomograms comprises calculating said respective positions of said magnetic resonance tomograms along said trajectory from prescribable axial positions on one of said three orthogonal axes of said coordinate system.

3. A method as claimed in claim 1 wherein the step of obtaining a magnetic resonance exposure of said body region comprises obtaining a ceMRA exposure of said body region.

4. A method as claimed in claim 1 comprising displaying said magnetic resonance exposure in an MIP presentation.

5. A method as claimed in claim 1 wherein the step of prescribing said trajectory comprises displaying at least one perspective presentation of said magnetic resonance exposure, and marking a plurality of points via an input device in said perspective presentation.

6. A method as claimed in claim 1 wherein the step of prescribing said trajectory comprises displaying at least one three-dimensional presentation of said magnetic resonance exposure, and marking a plurality of points via an input device in said three-dimensional presentation.

7. A method as claimed in claim 1 wherein the step of prescribing a trajectory comprises prescribing a trajectory for a channel-like internal anatomical structure, by displaying a presentation of said magnetic resonance exposure, marking a point in said presentation, and automatically determining a further course of said trajectory using an image recognition algorithm.

8. A method as claimed in claim 1 wherein the step of acquiring said magnetic resonance tomograms comprises entering respective start signals for initiating acquisition of said magnetic resonance tomograms.

9. A method as claimed in claim 1 wherein said coordinate system has three orthogonal axes, and comprising the additional step, for acquiring said magnetic resonance tomograms, of entering an axial position on one of said orthogonal axes for each of said magnetic resonance tomograms, and acquiring and presenting said magnetic resonance tomograms respectively at said axial positions.

10. A method as claimed in claim 1 comprising the additional step of introducing an interventional medical instrument into said body region by an introduced length of said instrument, identifying a value for said introduced length, and wherein the step of calculating the respective positions of said magnetic resonance tomograms along said trajectory comprises calculating the respective positions of said magnetic resonance tomograms along said trajectory dependent on said value of said introduced length.

11. A magnetic resonance system comprising:

a magnetic resonance data acquisition device having a coordinate system associated therewith having three orthogonal axes;

a control unit for operating said magnetic resonance data acquisition device to obtain a magnetic resonance exposure;

a calculating unit and an input device allowing at least one input into said calculating unit, said calculating unit automatically determining a trajectory as a three-dimensional curve in a body region in said exposure in said coordinate system from said input, and automatically calculating different respective positions and angular attitudes for each of a plurality of tomograms, each containing a segment of said trajectory, dependent on prescribable axial positioning on one of said three orthogonal axes entered via said input unit, for maximizing the segment of said trajectory contained in each said magnetic resonance tomograms, said calculating unit supplying said respective positions of said magnetic resonance tomograms to said control unit and said control unit operating said magnetic resonance data acquisition device to obtain said magnetic resonance tomograms at said respective positions.

12. A magnetic resonance system as claimed in claim 11 for use in an interventional procedure employing a medical instrument which is introduced, by an introduced length, into said body region, and further comprising a measurement device for measuring said introduced length and for supplying a measurement of said introduced length to said calculating device, said calculating device calculating said respective positions of said magnetic resonance tomograms dependent on said measurement of said introduced length.

* * * * *